(12) United States Patent
Derderian et al.

(10) Patent No.: US 7,312,163 B2
(45) Date of Patent: Dec. 25, 2007

(54) ATOMIC LAYER DEPOSITION METHODS, AND METHODS OF FORMING MATERIALS OVER SEMICONDUCTOR SUBSTRATES

(75) Inventors: Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 10/671,922

(22) Filed: Sep. 24, 2003

(65) Prior Publication Data

US 2005/0064725 A1    Mar. 24, 2005

(51) Int. Cl.
*H01L 21/44* (2006.01)
*H01L 21/469* (2006.01)

(52) U.S. Cl. ............. 438/778; 438/680; 438/758; 438/762; 438/765; 438/649; 257/E21.413; 257/E21.171; 257/E21.281; 257/E21.584; 427/429.1; 427/429.15

(58) Field of Classification Search ............. 438/674, 438/676, 680–681, 762, 765–766, 768–769, 438/771–772, 778, 758, 791; 427/249.1, 427/249.15; 257/E21.143, E21.171, E21.281
See application file for complete search history.

(56) References Cited

U.S. PATENT DOCUMENTS

| | | | |
|---|---|---|---|
| 6,022,595 A | 2/2000 | McDonald et al. | |
| 6,566,262 B1 | 5/2003 | Rissman et al. | |
| 6,630,201 B2 * | 10/2003 | Chiang et al. | 427/255.28 |
| 6,740,585 B2 * | 5/2004 | Yoon et al. | 438/680 |
| 6,800,173 B2 * | 10/2004 | Chiang et al. | 156/345.33 |
| 6,812,157 B1 | 11/2004 | Gadgil | |
| 6,869,876 B2 * | 3/2005 | Norman et al. | 438/680 |
| 2002/0073924 A1 * | 6/2002 | Chiang et al. | 118/723 R |

(Continued)

FOREIGN PATENT DOCUMENTS

WO    WO02/27063 A2    4/2002

OTHER PUBLICATIONS

Web page—Periodic Table—Oxygen. www.webelements.com/webelements/compounds/text/O/F201-7783417.html 3 pages.

(Continued)

*Primary Examiner*—Michael Lebentritt
*Assistant Examiner*—Mohsen Ahmadi
(74) *Attorney, Agent, or Firm*—Wells St. John P.S.

(57) ABSTRACT

The invention includes methods in which at least two different precursors are flowed into a reaction chamber at different and substantially non-overlapping times relative to one another to form a material over at least a portion of a substrate, and in which at least one of the precursors is asymmetric with respect to a physical property. A field influencing the asymmetric physical property is oriented within the reaction chamber, and is utilized to affect alignment of the precursor having the asymmetric property as the material is formed. The asymmetric physical property can, for example, be an anisotropic charge distribution associated with the precursor, and in such aspect, the field utilized to influence the asymmetric physical property can be an electric field provided within the reaction chamber and/or a magnetic field provided within the reaction chamber. The methodology of the present invention can be utilized in atomic layer deposition processes.

8 Claims, 4 Drawing Sheets

U.S. PATENT DOCUMENTS

| | | | |
|---|---|---|---|
| 2002/0076481 A1* | 6/2002 | Chiang et al. | 427/8 |
| 2002/0076490 A1* | 6/2002 | Chiang et al. | 427/248.1 |
| 2002/0076507 A1* | 6/2002 | Chiang et al. | 427/569 |
| 2002/0076508 A1* | 6/2002 | Chiang et al. | 427/569 |
| 2003/0049931 A1 | 3/2003 | Byun et al. | |
| 2003/0143841 A1 | 7/2003 | Yang et al. | |
| 2004/0211665 A1* | 10/2004 | Yoon et al. | 204/298.01 |
| 2004/0224504 A1* | 11/2004 | Gadgil | 438/680 |
| 2005/0051100 A1* | 3/2005 | Chiang et al. | 118/728 |
| 2005/0064725 A1 | 3/2005 | Derderian et al. | |

OTHER PUBLICATIONS

Web page—Volland, Dr. Walt, Online Introductory Chemistry—Polar Molecular Compounds www.scidiv.bcc.cuc.edu/wv/5/0005-009-poler-molecules.html 4 pages.

Luhann et al., "A Reversibly Switching Surface," Science— vol 299, Jan. 17, 2003. pp. 371-374.

Sun et al., "Shape-Controlled Synthesis of gold and Silver Nanoparticles," Science—vol. 298, Dec. 13, 2002, pp. 2176-2179.

Hausmann et al., "Rapid Vapor Desposition of Highly Conformal Silicn Nanoaminetics" Science—vol. 298, Oct. 11, 2002, pp. 402-406.

Malynyeh et al., "Poly(Vinyl Pyridine) as a Universal Surface Modifer for Immobilization of Nanoparticles," American Chemical Society © 2002, Jan. 19, 2002.

Feng et al., "Study of the photophysical properties of composite film assembled of porphydin and TIQ , nanoparticles," Elsevier Science S.A. © 1999.

Arign et al., Ultrathin films of inorganic materials (SIO , nanoparticle, monumorillonite microplano, and molybdenum oxide) prepared by alternate layer-by-layer assembly with organic polyions, Elsevier Science B.V. © 1999.

* cited by examiner

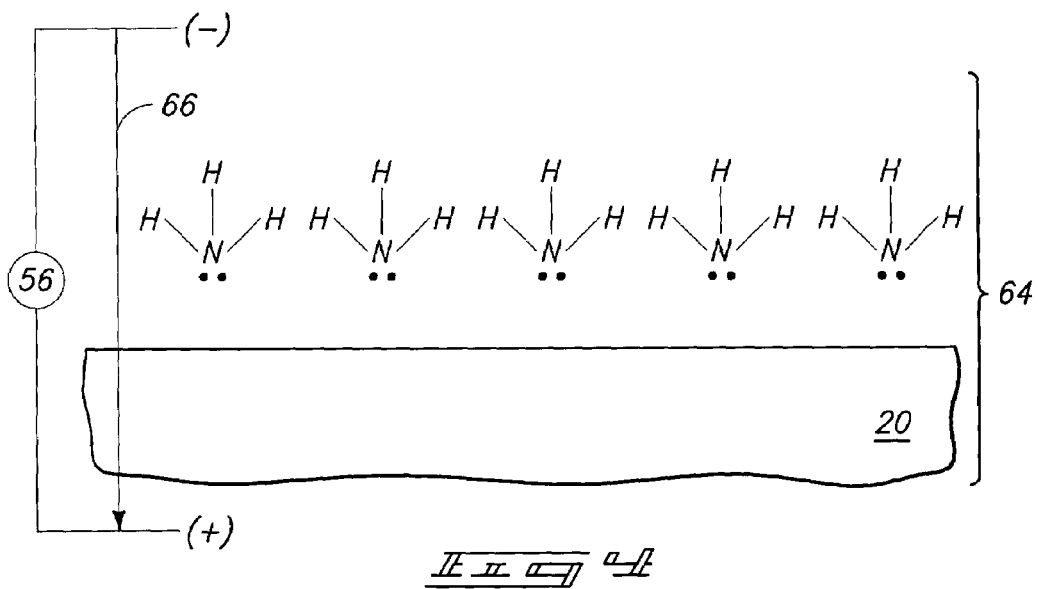
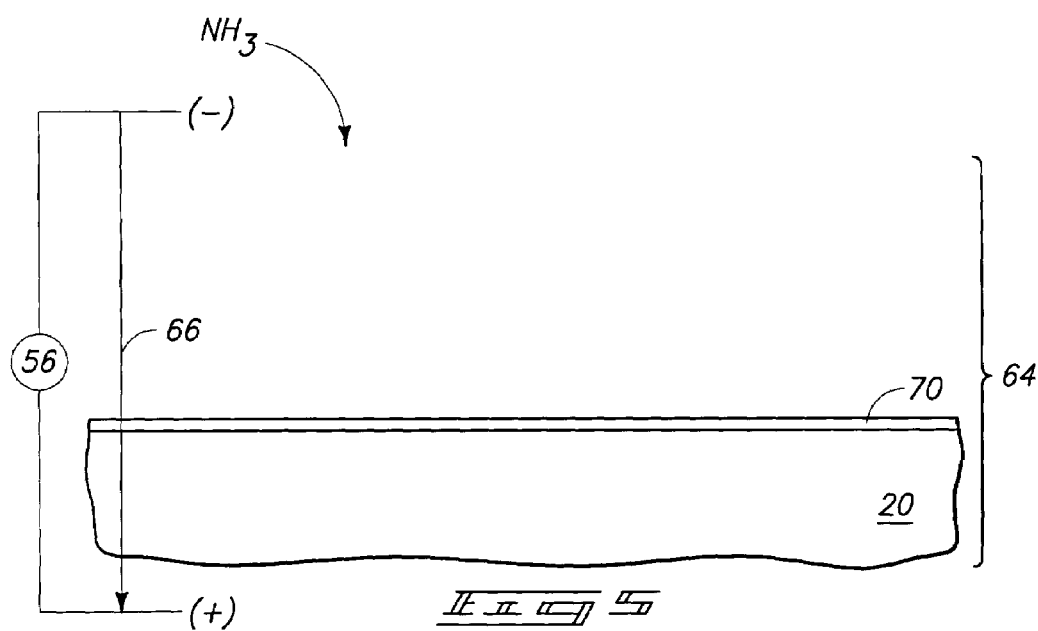

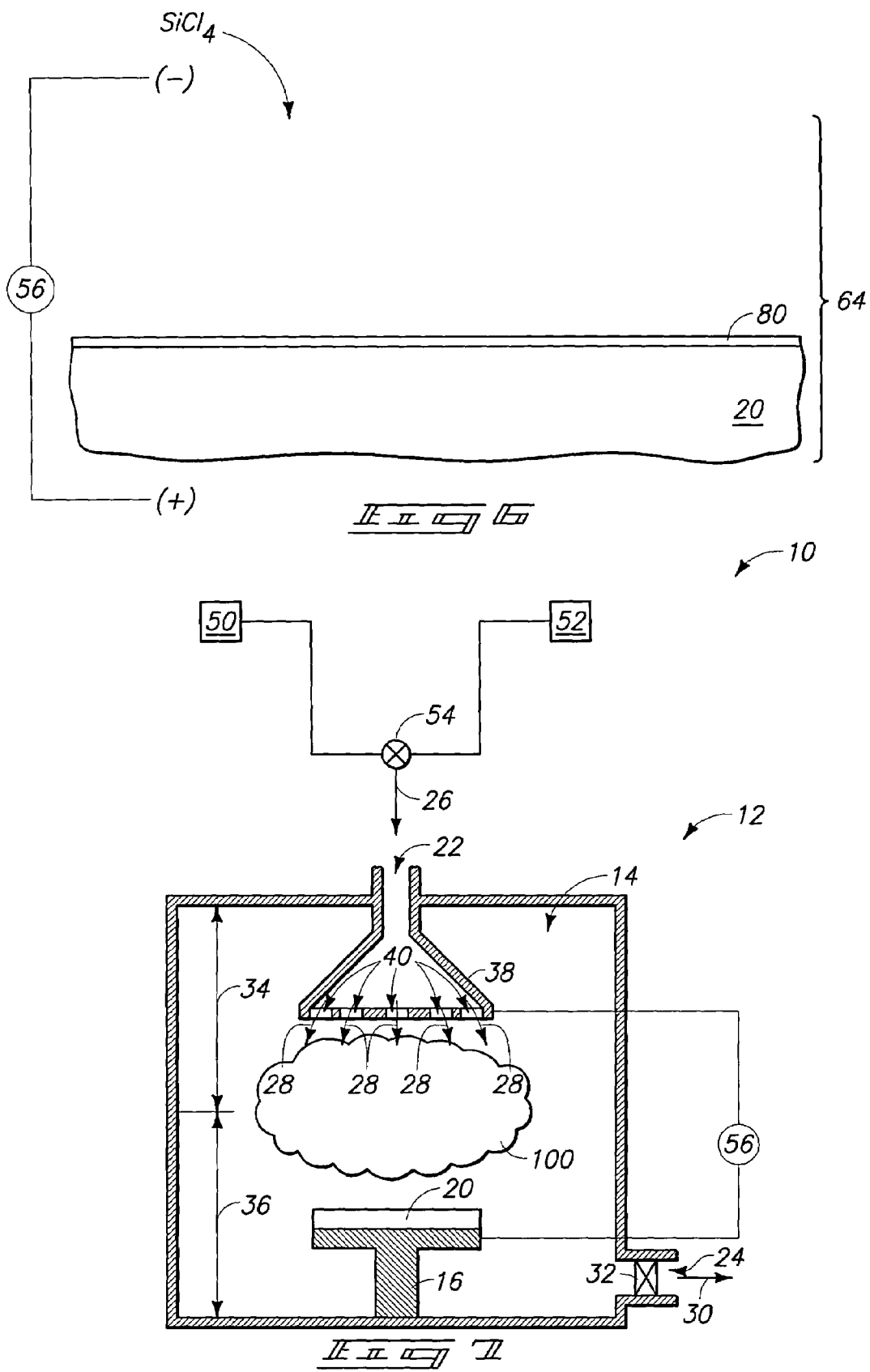

ATOMIC LAYER DEPOSITION METHODS, AND METHODS OF FORMING MATERIALS OVER SEMICONDUCTOR SUBSTRATES

TECHNICAL FIELD

The invention pertains to atomic layer deposition (ALD) methods, and also pertains to methods which can be utilized for forming materials over semiconductor substrates.

BACKGROUND OF THE INVENTION

Semiconductor fabrication frequently involves formation of layers over appropriate substrates. Numerous deposition methods can be utilized to form the layers, including, for example, chemical vapor deposition (CVD), atomic layer deposition (ALD), physical vapor deposition (PVD), etc. The invention described herein, while not limited to any particular deposition process except to the extent explicitly stated in the claims which follow, can be particularly useful for ALD technology.

ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

The deposition methods herein are described in the context of formation of materials on one or more semiconductor substrates. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the step repeated with the exposure of the second species monolayer to the first species. In some cases, the two monolayers may be of the same species. Also, a third species or more may be successfully chemisorbed and purged just as described with first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption by-products to desorb and reduces the concentration of a species preparatory to introducing another species. A suitable amount of purging can be determined experimentally as known to those skilled in the art.

ALD is often described as a self-limiting process in that a finite number of sites exist on a substrate to which the first species may form chemical bonds. The second species might only bond to the first species and thus may also be self-limiting. Once all of the finite number of sites on the substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein as being ALD processes are applicable to any circumstance where ALD may be desired. It is further noted that local chemical reactions can occur during ALD (for instance, an incoming reactive molecule can displace a molecule from an existing surface rather than forming a monolayer over the surface). To the extent that such chemical reactions occur, they are generally confined within the uppermost monolayer of the surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting ALD layer.

The general technology of chemical vapor deposition (CVD) includes a variety of more specific processes, including, but not limited to, plasma-enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD when a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species can be chemisorbed to a substrate or previously deposited species, providing a surface under which subsequent species may next chemisorb to form the complete layer of desired material.

Under most CVD conditions, deposition occurs largely independent of the composition of surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate.

Though the invention has particular application for improving ALD processes, it is to be understood that the invention can have application to other deposition processes. Accordingly, the invention is not to be limited to ALD processes, except to the extent that ALD processes are explicitly recited in the claims that follow.

SUMMARY OF THE INVENTION

In one aspect the invention includes an atomic layer deposition method in which an electric field gradient and/or a magnetic field gradient is utilized within an atomic layer deposition reaction chamber to align precursor molecules during atomic layer deposition. If both an electric field gradient and a magnetic field gradient are utilized, the electric field gradient can be independent of the magnetic field gradient, or the electric field gradient and magnetic field gradient can be together comprised by an electromagnetic field.

In one aspect the invention encompasses a method of forming a material over a semiconductor substrate. The semiconductor substrate is provided with a reaction chamber, and at least two different precursors are flowed into the reaction chamber at different and substantially non-overlapping times relative to one another to form the material over at least a portion of the substrate. At least one of the precursors is asymmetric with respect to a physical property, and a field influencing the asymmetric physical property is oriented within the reaction chamber during formation of the material from the precursor.

In one aspect the invention encompasses a process in which a semiconductor substrate is provided within a reaction chamber and a precursor is flowed into the reaction chamber as part of an ALD process. The precursor within the reaction chamber is in the form of a population of precursor molecules. The individual precursor molecules have an anisotropic charge distribution, and have an electronic axis extending from a relatively electrically negative pole of the molecules to a relatively electrically positive pole of the molecules. An electric field within the reaction chamber is oriented while the precursors are within the reaction chamber, and the oriented electric field influences an averaged direction of the electronic axes within the population of the precursor molecules in the reaction chamber.

BRIEF DESCRIPTION OF THE DRAWINGS

Preferred embodiments of the invention are described below with reference to the following accompanying drawings.

FIG. 4 is a diagrammatic, cross-sectional view of a region of a reaction chamber proximate a substrate illustrating a deposition method of the present invention utilizing ammonia as a precursor.

FIG. 5 is a diagrammatic, cross-sectional view of a portion of a reaction chamber shown at a preliminary processing stage of an exemplary ALD process of the present invention.

FIG. 6 is a view of the FIG. 5 chamber portion shown at a processing stage subsequent to that of FIG. 5.

FIG. 7 is a diagrammatic, cross-sectional view of an exemplary reaction chamber in accordance with an alternative embodiment of the present invention relative to that described with reference to FIG. 1.

DETAILED DESCRIPTION OF THE PREFERRED EMBODIMENTS

Figure 1:
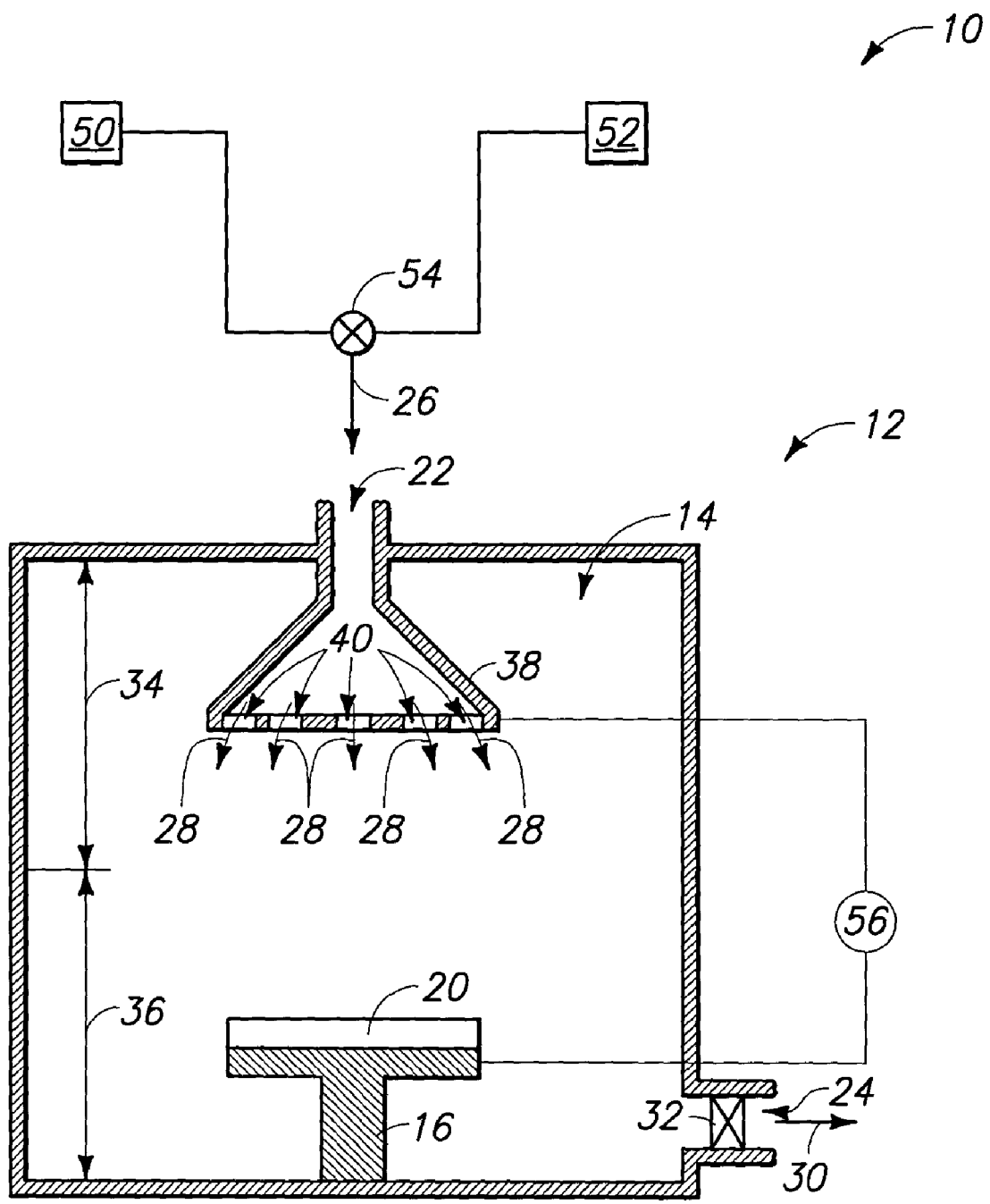
FIG. 1 is a diagrammatic, cross-sectional view of an exemplary apparatus which can be utilized in an exemplary aspect of the present invention.

This disclosure of the invention is submitted in furtherance of the constitutional purposes of the U.S. Patent Laws "to promote the progress of science and useful arts" (Article 1, Section 8).

The invention includes methods in which one or more asymmetric physical properties of a precursor are utilized to align the precursor during a deposition process. Specifically, a field influencing an asymmetric physical property of a precursor is oriented within a reaction chamber during a deposition process utilizing the precursor, and the influence of the oriented field affects an alignment of the precursor within the reaction chamber.

In particular aspects, the asymmetric physical property of the precursor can be an electronic distribution around the precursor, and the oriented field within the reaction chamber can be an electric field and/or a magnetic field. If both an electric field gradient and a magnetic field gradient are utilized, the electric field gradient can be independent of the magnetic field gradient, or the electric field gradient and magnetic field gradient can be together comprised by an electromagnetic field. The precursor having the asymmetric electronic distribution can be an electrically neutral precursor (such as, for example, ammonia), or can be an electrically charged precursor.

In some aspects of the invention, two or more precursors can be flowed into a reaction chamber to form a material over at least a portion of a substrate. The different precursors can be within the reaction chamber at overlapping times during, for example, chemical vapor deposition processes or other processes in which it is desired to have two or more precursors simultaneously within the reaction chamber. In other aspects of the invention, different precursors can be flowed into the reaction chamber at different and substantially non-overlapping times relative to one another to form a material over at least a portion of the substrate. Such aspect can occur in, for example, ALD processes in which it is desired to remove substantially all of one precursor from within a reaction chamber prior to introducing another precursor into the reaction chamber. The term "substantially all" is utilized to indicate that an amount of precursor within the reaction chamber is reduced to a level where gas phase reactions with subsequent precursors (or reactant gases) do not degrade the properties of a material deposited on the substrate. Such can, in particular aspects, indicate that all of a first precursor is removed from the reaction chamber prior to introducing a second precursor, or that at least all measurable amounts of the first precursor are removed from the reaction chamber prior to introducing the second precursor into the chamber.

If two or more precursors are introduced into a reaction chamber at different and substantially non-overlapping times relative to one another to form a material over a substrate, all of the precursors can be asymmetric relative to a property influenced by the field introduced into the reaction chamber, or only some of the precursors can be asymmetric relative to the property influenced by the field. In either event, the field can be altered at the time when one precursor is introduced into the reaction chamber relative to a time when a different precursor is introduced into the reaction chamber. For instance, the field can be turned off when a particular precursor is within the reaction chamber, and turned on when a different precursor is within the reaction chamber. Alternatively, the field can be oriented to increase along a first axis when one of the precursors is introduced into the reaction chamber, and can then be changed to increase along a different axis when another precursor is introduced into the reaction chamber.

Various aspects of the invention are described with reference to FIGS. 1-7 for a particular application in which an electric field is utilized to control alignment of one or more polar, or otherwise anisotropic precursors within a reaction chamber.

Referring initially to FIG. 1, an exemplary apparatus 10 suitable for utilization in particular exemplary aspects of the present invention is shown. Apparatus 10 includes a vessel 12 having a reaction chamber 14 therein. A substrate holder 16 is provided within the reaction chamber 14, and such supports a substrate 20. Substrate 20 can be, for example, a semiconductor substrate, such as, for example, a monocrystalline silicon wafer.

An inlet 22 extends through a sidewall of vessel 12 and into reaction chamber 14, and an outlet 24 extends through a sidewall of vessel 12 and from reaction chamber 14. In operation, reactants (i.e., precursors) are introduced into inlet 22 and flowed into reaction chamber 14 (as indicated by arrows 26 and 28), and materials are purged or otherwise exhausted from chamber 14 thorough outlet 24 (as indicated by arrow 30).

A valve 32 is shown across outlet 24, and such can be utilized to control flow of materials through outlet 24. Additional valves (not shown) can be provided in apparatus 10 to control flow through reaction chamber 14, with an exemplary location for an additional valve being across inlet 22. Additionally, a pump (not shown) can be provided downstream from outlet 24 to assist in exhausting materials from within reaction chamber 14.

Reaction chamber 14 can be considered to comprise an upper region 34 and a lower region 36 in the shown exemplary application. Substrate 20 is provided within the lower region 36. A dispersal structure 38 is provided within the upper region 34, and is utilized to disperse precursor across an upper surface of substrate 20. Dispersal structure 38 has a plurality of orifices 40 extending therethrough, and such orifices are utilized to direct the precursor as indicated by the arrows 28. An exemplary dispersal structure 38 is a so-called showerhead.

Apparatus 10 is configured for flow of a pair of precursors into reaction chamber 14. Specifically, a pair of sources 50 and 52, comprising first and second precursor materials respectively, are shown upstream of inlet 22. The sources are in fluid communication with a valve 54 so that material can be flowed from the sources, through valve 54, and then into inlet 22. Valve 54 can be configured so that only one precursor at a time can be flowed from sources 50 and 52 into chamber 14. In other words, valve 54 can be configured so that precursor flow from source 50 into reaction chamber 14 is exclusive relative to precursor flow from source 52, and vice versa. Accordingly, precursor flow from source 50 will be at a different time than precursor flow from source 52. Further, if reaction chamber 14 is purged between the time that precursor is flowed from source 50 into the chamber and the time that precursor is flowed from source 52 into the chamber, the precursors from sources 50 and 52 will not mix within chamber 14. In such applications, precursor flow from sources 50 and 52 into chamber 14 will be at different and substantially non-overlapping times relative to one another, and typically will be at different and absolutely non-overlapping times relative to one another. Apparatus 10 can thus be utilized for ALD processes.

The apparatus 10 is shown schematically, and it is to be understood that other configurations can be utilized for ALD processes to accomplish non-overlapping flow of two or more precursors into a reaction chamber. Also, it is to be understood that additional materials can be flowed into the reaction chamber besides the precursors from sources 50 and 52. For instance, an inert gas can be flowed into the reaction chamber either with precursor to assist in flowing the precursor into the reaction chamber, or after the flow of precursor to assist in purging the precursor from the reaction chamber.

Apparatus 10 is configured to establish an electric field between the upper region 34 of reaction chamber 14 and the lower region 36. Specifically, the dispersal structure 38 and wafer holder 16 are electrically connected to a power source 56 to establish a charge differential between the upper region 34 and the lower region 36 of reaction chamber 14, and to thereby establish an electric field within the reaction chamber. The electric field gradient can, in particular aspects, be considered to be formed by electrically biasing the substrate 20 relative to one or more structures (including the shown dispersal structure 38) in the upper portion of the reaction chamber 14.

The configuration of FIG. 1 is but one of many methods that can be utilized to establish an electric field gradient within a reaction chamber, and it is to be understood that other methods can be used in various aspects of the invention. For instance, instead of utilizing a common power source 56 to provide a charge differential between a structure in the upper region of the reaction chamber and a structure in the lower region of the reaction chamber, it is to be understood that multiple power sources could be utilized. Also, it is to be understood that a charge differential between the upper region of the reaction chamber and the lower region of the reaction chamber can be established by providing a charge differential between other structures either additionally to, or alternatively to those shown. Further, an electric field can be established in other orientations within reaction chamber 14 instead of, or additionally to, the shown gradient extending between the upper region of the chamber and the lower region of the chamber. For instance, a charge gradient can be established between the shown left side of the reaction chamber and the shown right side of the chamber.

The electric field established between the upper region 34 of reaction chamber 10 and the lower region 36 can be utilized during an ALD process, or other deposition processes, for aligning molecules having an anisotropic charge distribution. An exemplary molecule having an anisotropic charge distribution is ammonia ($NH_3$).

Figure 2:
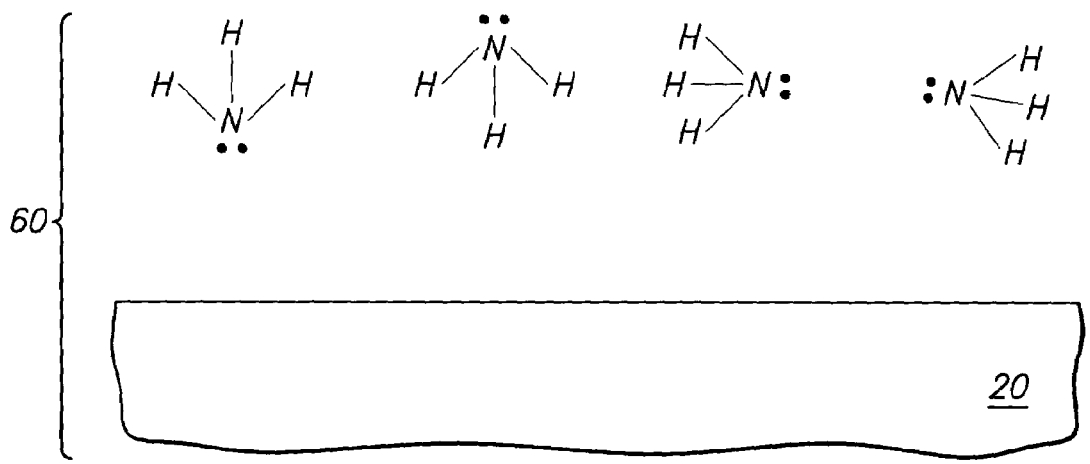
FIG. 2 is a diagrammatic, cross-sectional view of a region of a reaction chamber proximate a substrate at a preliminary processing stage of a prior art method utilizing ammonia ($NH_3$) as a precursor.

FIG. 2 illustrates an exemplary prior art deposition process utilizing $NH_3$. Specifically, FIG. 2 illustrates a region 60 within a reaction chamber. Region 60 comprises the substrate 20 described above, and comprises $NH_3$ precursors proximate an upper surface of the substrate 20. The $NH_3$ precursors are randomly distributed.

Figure 3:
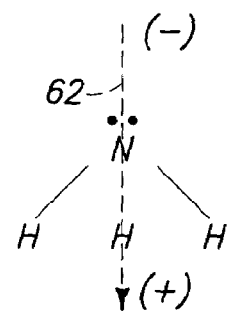
FIG. 3 is a diagrammatic view of an ammonia molecule illustrating an electronic axis (i.e. dipole) associated with the molecule.

FIG. 3 illustrates a molecule of $NH_3$ and shows that the molecule possesses a dipole. Specifically, the molecule has an electronic axis 62 extending from a relatively electrically negative pole of the molecule to a relatively electrically positive pole of the molecule. Accordingly, the molecule has an anisotropic charge distribution.

FIG. 4 illustrates a region 64 of a reaction chamber illustrating an aspect of the present invention during deposition with $NH_3$ precursors. Region 64 comprises the substrate 20 described above, and comprises a plurality of $NH_3$ precursors proximate an upper surface of the substrate 20. An electric field gradient 66 is established with power source 56, and such gradient aligns the $NH_3$ precursors within the reaction chamber. The alignment of the precursors can provide various improvements in an ALD process of the present invention relative to prior art processes, including, for example, improved surface coverage, and more efficient reactions (which can reduce the exposure time for a precursor utilized in methodology of the present invention relative to the same precursor utilized in prior art methodology).

The shown individual $NH_3$ precursor molecules can be considered to be a population of precursor molecules. The oriented electric field 66 provided by power source 56 can be considered to influence an averaged direction of the electronic axes of the population of the precursor molecules within the reaction chamber, as well as, or alternatively to, considering the electric field to influence any particular individual molecule of $NH_3$. In other words, a given population of molecules of $NH_3$ within a reaction chamber will have an averaged direction of the electronic axes of the individual molecules. In the absence of an oriented electronic field, the molecules will theoretically be entirely randomly distributed within the reaction chamber, and accordingly the averaged direction of the electronic axes across the population of precursor molecules will be zero. In contrast, provision of an oriented electric field within a reaction chamber in accordance with an aspect of the present invention can induce a charge across the population of precursors, which reduces randomness of the distribution and thus creates a measurable non-zero averaged direction of the electronic axes within the population of precursor molecules. In particular aspects, all of the precursor molecules may be exactly aligned along the electric field axis 66 as shown in FIG. 4. In other aspects, the population of precursor molecules can include some precursors which are not absolutely aligned along the electric field gradient 66, but nonetheless the population as a whole can have an averaged electronic axis which extends approximately along the electric field gradient established by power source 56.

$NH_3$ is but one precursor having an anisotropic charge distribution which can be influenced by an electric field. Numerous other precursors are known which can also be influenced by electronic field. The precursors can, commonly to $NH_3$, comprise nitrogen and hydrogen, or can comprise entirely different elements than $NH_3$.

The shown charge gradient 66 is utilized to align the nitrogen of $NH_3$ toward an upper surface of substrate 20. It is to be understood that the invention includes other aspects (not shown) in which a charge gradient is utilized to align $NH_3$ in an opposite direction. Also, depending on the precursor, it may be desired to align charge gradient 66 in a direction different than that shown in FIG. 4. In particular aspects of the invention, two or more precursors can be utilized, and charge gradient 66 can be changed between the time that one of the precursors is within the reaction chamber and the time that another of the precursors is within the reaction chamber.

The shown gradient 66 can be considered to be a vector indicating that the electric field increases from the negative pole to the positive pole. In particular aspects of the invention, it can be desired to utilize a first electric field vector during provision of one precursor, and to then change the vector prior to, during, or after provision of a second precursor within a reaction chamber, and to maintain the electric field along the second vector for at least some period of time while the second precursor is within the reaction chamber. The second vector can be in any appropriate orientation relative to the first vector, including, for example, an orientation which is exactly opposite to the first vector (i.e., an orientation in which an angular difference between the first and second vectors is about 180°). In some aspects it can be desired to orient the second electric field vector exactly opposite to the first electric field vector prior to flowing the second precursor, and to use the second electric field vector to alleviate undesired reaction of any residual first precursor with a film formed over the substrate from the first precursor.

An exemplary ALD system utilizing $NH_3$ and $SiCl_4$ to form a material (such as, for example, silicon nitride) is described with reference to FIGS. 5 and 6. In describing FIGS. 5 and 6, similar numbering will be used as was used above in describing FIGS. 1-4, where appropriate.

Referring initially to FIG. 5, a substrate 20 is shown within the portion 64 of a reaction chamber. A power source 56 is utilized to generate an electric field gradient 66 within the chamber, and $NH_3$ is flowed into the chamber as a precursor utilized to form a layer 70 over at least a portion of an upper surface of substrate 20 (in the shown embodiment, layer 70 is formed over an entirety of the shown upper surface of substrate 20). Layer 20 can correspond to a monolayer in particular aspects of the invention.

Referring to FIG. 6, the ammonia has been removed from the reaction chamber and subsequently $SiCl_4$ is flowed into the reaction chamber. As the process of FIGS. 5 and 6 is an ALD process, the $SiCl_4$ can be flowed into the reaction chamber at a substantially non-overlapping time relative to the flow of the ammonia into the reaction chamber.

FIG. 6 illustrates power source 56, but does not show an electric field gradient generated by the power source. Since $SiCl_4$ has an isotropic charge distribution, the molecule will not be aligned by an electric field generated within the reaction chamber. Accordingly, the electric field can be turned off when the $SiCl_4$ is present in the reaction chamber. Alternatively, the electric field can be left on in the reaction chamber, as it should not adversely impact the deposition of $SiCl_4$.

The $SiCl_4$ is incorporated within the material 70 (FIG. 5), to convert the material to a material 80. In particular aspects, material 70 of FIG. 5 comprises, consists essentially of, or consists of silicon, nitrogen and hydrogen; and material 80 of FIG. 6 comprises, consists essentially of, or consists of $Si_3N_4$.

The ammonia of FIG. 5 can be considered first molecules in the processing of FIGS. 5 and 6, and the $SiCl_4$ of FIG. 6 can be considered second molecules. Material 70 of FIG. 5 can be considered to comprise components of the first molecules, and material 80 can be considered to comprise components of the first and second molecules. Materials 70 and 80 are described to comprise "components" of the first and second precursor molecules to indicate that the materials comprise at least portions of the first and second precursor molecules. In particular applications the materials can comprise an entirety of one or both of the first and second precursor molecules incorporated therein, and in some applications the materials can comprise only a portion of one or both of the precursor molecules incorporated therein.

The diagrammatic illustration of FIGS. 5 and 6 shows but one of many types of ALD processes. In other processes, the second precursor would form a physically distinct layer from that formed by the first precursor. Such processes can still be considered as forming a common material from the first and second precursors, but in such case the material comprises two discrete layers. The processing of FIGS. 5 and 6 can be considered to be one iteration of an ALD process, and in particular aspects the iteration can be repeated multiple times to form material 80 to a desired thickness.

The aspect of FIG. 1 is but one exemplary aspect of a reaction chamber which can be utilized in methodology of the present invention. FIG. 7 illustrates another exemplary aspect. FIG. 7 is shown with identical numbering as was utilized in describing FIG. 1. The apparatus of FIG. 7 can be seen to be identical to that described above reference to FIG. 1, except that the apparatus of FIG. 7 comprises a plasma 100 which was absent from the apparatus of FIG. 1. The apparatus of FIG. 7 can be utilized in, for example, plasma-enhanced ALD. If chamber 10 is utilized in plasma-enhanced ALD, the plasma 100 can be present together with one or more of the precursors utilized in the ALD. Reaction chamber 10 can alternatively be utilized for plasma-enhanced CVD, or other plasma-enhanced deposition processes. If electric field vectors are utilized in combination with plasma-enhanced ALD or plasma-enhanced CVD, the vectors can be utilized to orient ions formed during the plasma-enhanced processes.

Any of the processes described and claimed herein can be utilized in combination with other processes. For instance, an ALD process described and claimed herein can be utilized in combination with one or more CVD processes and/or one or more ALD processes.

The electric field gradient described with reference to FIGS. 1-7 is but one type of field that can be utilized to orient molecules during a deposition process, and it is to be understood that other field gradients can be utilized in various aspects of the invention. For instance, in some aspects of the invention the described electric field can be replaced by a magnetic field, and in yet other aspects a magnetic field can be utilized in combination with an electric field.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method comprising utilization of an electric field gradient within an atomic layer deposition reaction chamber to align non-ionized and electrically neutral molecules during the atomic layer deposition as at least portions of the non-ionized and electrically neutral molecules are incorporated into a material formed over a semiconductor substrate;

wherein the molecules are first molecules;

the atomic layer deposition process comprises provision of second molecules into the atomic layer deposition reaction chamber at a substantially non-overlapping time relative to the first molecules and incorporation of at least portions of the second molecules into the material formed over the semiconductor substrate; and the electric field gradient is removed from within the atomic layer deposition reaction chamber prior to incorporating at least portions of the second molecules into the material.

2. The method of claim 1 wherein a plasma is present in the atomic layer deposition reaction chamber during the incorporation of at least portions of the molecules into the material.

3. The method of claim 1 wherein:

the atomic layer deposition reaction chamber has a lower portion and an upper portion;

the substrate is in the lower portion; and the electric field gradient is formed by electrically biasing the substrate relative to one or more structures in the upper portion of the atomic layer deposition reaction chamber.

4. The method of claim 1 wherein the first molecules are ammonia and the second molecules are $SiCl_4$.

5. The method of claim 1 wherein:

the electric field gradient is in a first configuration during the incorporation of at least portions of the first molecules into the material and is in a second configuration, different from the first configuration, during the incorporation of at least portions of the second molecules into the material.

6. An atomic layer deposition method comprising utilization of a magnetic field gradient within an atomic layer deposition reaction chamber to align non-ionized and electrically neutral molecules during the atomic layer deposition as at least portions of the non-ionized and electrically neutral molecules are incorporated into a material formed over a semiconductor substrate.

7. An atomic layer deposition method comprising utilization of an electric field gradient within an atomic layer deposition reaction chamber to align molecules during the atomic layer deposition as at least portions of the molecules are incorporated into a material formed over a semiconductor substrate;

wherein:

the molecules are first molecules;

the electric field gradient is in a first configuration during the incorporation of at least portions of the first molecules into the material;

the first configuration of the electric field gradient comprises an increase of the electric field along a first vector within the atomic layer deposition chamber during the alignment of the first molecules;

the atomic layer deposition process comprises provision of second molecules into the atomic layer deposition reaction chamber at a substantially non-overlapping time relative to the first molecules and incorporation of at least portions of the second molecules into the material formed over the semiconductor substrate;

after the incorporation of at least portions of the first molecules into the material, the electric field gradient is changed to a second configuration in which the electric field increases along a second vector different from the first vector;

the electric field gradient remains in the second configuration during the incorporation of at least portions of the second molecules into the material; and at least one of the first molecules and the second molecules being non-ionized and electrically neutral during incorporation into the material.

8. The method of claim 7 wherein an angular difference between the first and second vectors is about 180 degrees.

* * * * *

UNITED STATES PATENT AND TRADEMARK OFFICE
CERTIFICATE OF CORRECTION

| | | |
|---|---|---|
| PATENT NO. | : 7,312,163 B2 | Page 1 of 1 |
| APPLICATION NO. | : 10/671922 | |
| DATED | : December 25, 2007 | |
| INVENTOR(S) | : Derderian et al. | |

It is certified that error appears in the above-identified patent and that said Letters Patent is hereby corrected as shown below:

In column 10, line 11, in Claim 4, delete "SiCI$_4$." and insert -- SiCl$_4$. --, therefor.

Signed and Sealed this

Twenty-ninth Day of April, 2008

JON W. DUDAS
*Director of the United States Patent and Trademark Office*